(12) United States Patent
Lambert

(10) Patent No.: US 6,230,896 B1
(45) Date of Patent: May 15, 2001

(54) UNIVERSAL SHIPPING TRAY

(75) Inventor: Donald L. Lambert, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/584,109

(22) Filed: May 31, 2000

(51) Int. Cl.$^7$ ................................................ B65D 89/00
(52) U.S. Cl. .......................................... 206/722; 206/564
(58) Field of Search .................................. 206/713, 714, 206/716, 722, 725, 562, 564, 438, 524.8, 461; 53/432, 79

(56) References Cited

U.S. PATENT DOCUMENTS

| | | | |
|---|---|---|---|
| 3,545,606 | * | 12/1970 | Pennett .................................. 206/714 |
| 4,778,326 | * | 10/1988 | Althouse et al. ..................... 206/716 |
| 6,105,783 | * | 8/2000 | Sato ...................................... 206/714 |

* cited by examiner

Primary Examiner—Paul T. Sewell
Assistant Examiner—Shian Luong

(57) ABSTRACT

A JEDEC-compatible universal shipping tray is provided for transporting packaged semiconductor devices. Embodiments include a tray having an array of hollow short pedestals that are commonly connected to a manifold, such as a sealed chamber. A flexible membrane, such as a polymer sheet, is placed over the top ends of the pedestals, then holes are punched in the membrane, as with a needle, to expose the top ends of selected pedestals. Packages to be shipped in the tray are placed over the exposed top ends of the pedestals, and a vacuum is drawn through a manifold vacuum valve to hold the packages to the pedestals against the membrane. Since the internal configuration of the tray of the present invention is not customized to fit a particular package, packages of different sizes and shapes can be shipped using a tray of the same design. Furthermore, partially filled trays can be shipped simply by leaving the membrane unpierced at the ends of pedestals that are not needed to support packages.

18 Claims, 3 Drawing Sheets

UNIVERSAL SHIPPING TRAY

FIELD OF THE INVENTION

The present invention relates to a shipping tray. The present invention has particular applicability in shipping packaged semiconductor devices.

BACKGROUND ART

Certain widely-used semiconductor device packages having high lead counts, such as thin small outline plastic packages (TSOPs), side small outline plasctic packages (SSOPs), pin grid arrays (PGAs), ball grid arrays (BGAs), etc. are typically loaded into trays for shipping to customers and for in-process handling or transport (e.g. for shipping to a test facility from a packaging facility). The trays protect the packages from electrical and mechanical damage during handling and shipment, and are also suitable for presenting the packages to processing equipment, such as test stations and circuit board assembly equipment. Trays are usually made of a polymer, such as polyvinylchloride (PVC), either carbon-filled or antistatically coated to provide electrostatic discharge (ESD) protection.

The trays are typically uniformly sized, in compliance with standard JEDEC outlines, and have an internal configuration to prevent excess motion of the package within the tray and to orient the package in a JEDEC standard way (e.g., "pin one orientation") to enable pick-and-place equipment to be compatible with all the packages. An example of a typical tray is depicted in FIG. 1, wherein five trays 100 are stacked for shipment, with a sixth tray 100 serving as a cover. Conventionally, a different tray is required for each specific package design. As a result, there are at least hundreds of different tray types in use. This requirement of a customized tray for each new package design is disadvantageous because customized trays are costly, and each new tray design typically has a long lead time associated with its development and manufacture. Since a new product cannot be shipped to customers or test facilities without a proper tray, tray customization undesirably increases the time to market for a new package design.

There exists a need for a shipping tray for packaged semiconductor devices that is usable with more than one package design, thereby reducing manufacturing costs and decreasing the time to market for new package designs.

SUMMARY OF THE INVENTION

An advantage of the present invention is a universal shipping tray for packaged semiconductor devices that is usable with many different package designs.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a tray for holding an article, the tray comprising a plurality of hollow tubular pedestals, each pedestal having an open top end and an open bottom end in communication with each other, the open top end having a surface area less than a surface area of the article; a manifold commonly connecting the bottom ends of the pedestals; a membrane for covering the top ends of the pedestals; and a vacuum valve attached to the manifold and connectable to a vacuum source for evacuating the manifold, the vacuum valve being for maintaining a vacuum in the manifold when the manifold is evacuated. The membrane is piercable to expose the top end of at least one of the pedestals to hold the article against the membrane when the manifold is evacuated and the article placed over the exposed top end.

Another aspect of the present invention is a method of preparing an article for transport, the method comprising providing a tray comprising a plurality of hollow tubular pedestals, each pedestal having an open top end and an open bottom end in communication with each other, a manifold commonly connecting the bottom ends of the pedestals, and a vacuum valve attached to the manifold and connectable to a vacuum source for evacuating the manifold, the vacuum valve being for maintaining a vacuum in the manifold; placing a flexible membrane over the pedestals; piercing the membrane to expose the top end of at least one of the pedestals; placing the article over the exposed top end; and evacuating the manifold to hold the article against the membrane.

Additional advantages of the present invention will become readily apparent to those skilled in this art from the following detailed description, wherein only the preferred embodiment of the present invention is shown and described, simply by way of illustration of the best mode cotemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional packaged semiconductor shipping trays are customized for each package design, which effectively increases the cost of the finished device and increases the time to market for a new package design. The present invention addresses and solves these problems stemming from conventional shipping techniques.

According to the present invention, a JEDEC-compatible universal shipping tray for transporting packaged semiconductor devices is provided wherein the packages are held in place by vacuum. Embodiments include a tray having an array of hollow short pedestals that are commonly connected to a manifold, such as a sealed chamber, having a vacuum valve. A flexible membrane, such as a polymer sheet, is placed over the top ends of the pedestals, then holes are punched in the membrane, as with a needle, to expose the top ends of selected pedestals. Packages to be shipped in the tray are placed over the exposed top ends of the pedestals, and a vacuum is drawn through the manifold vacuum valve via a vacuum source, such as conventional shop vacuum, to hold the packages to the pedestals against the membrane.

Since the internal configuration of the tray of the present invention is not customized to fit a particular package, a large variety of packages (i.e., packages of different sizes and shapes) can be shipped using a tray of the same design. Furthermore, partially filled trays can be shipped simply by leaving the membrane unpierced at the ends of pedestals that are not needed to support packages.

The tray according to the present invention enables a new package to be brought to market more quickly and reduces costs, since it eliminates the necessity for a custom-made shipping tray prior to the new product's introduction. The inventive tray can be used until a custom tray is available, or used instead of a custom tray. Furthermore, the inventive tray can be used as a sample tray; for example, to ship samples of the new product to customers prior to the availability of a custom tray.

Figure 1:
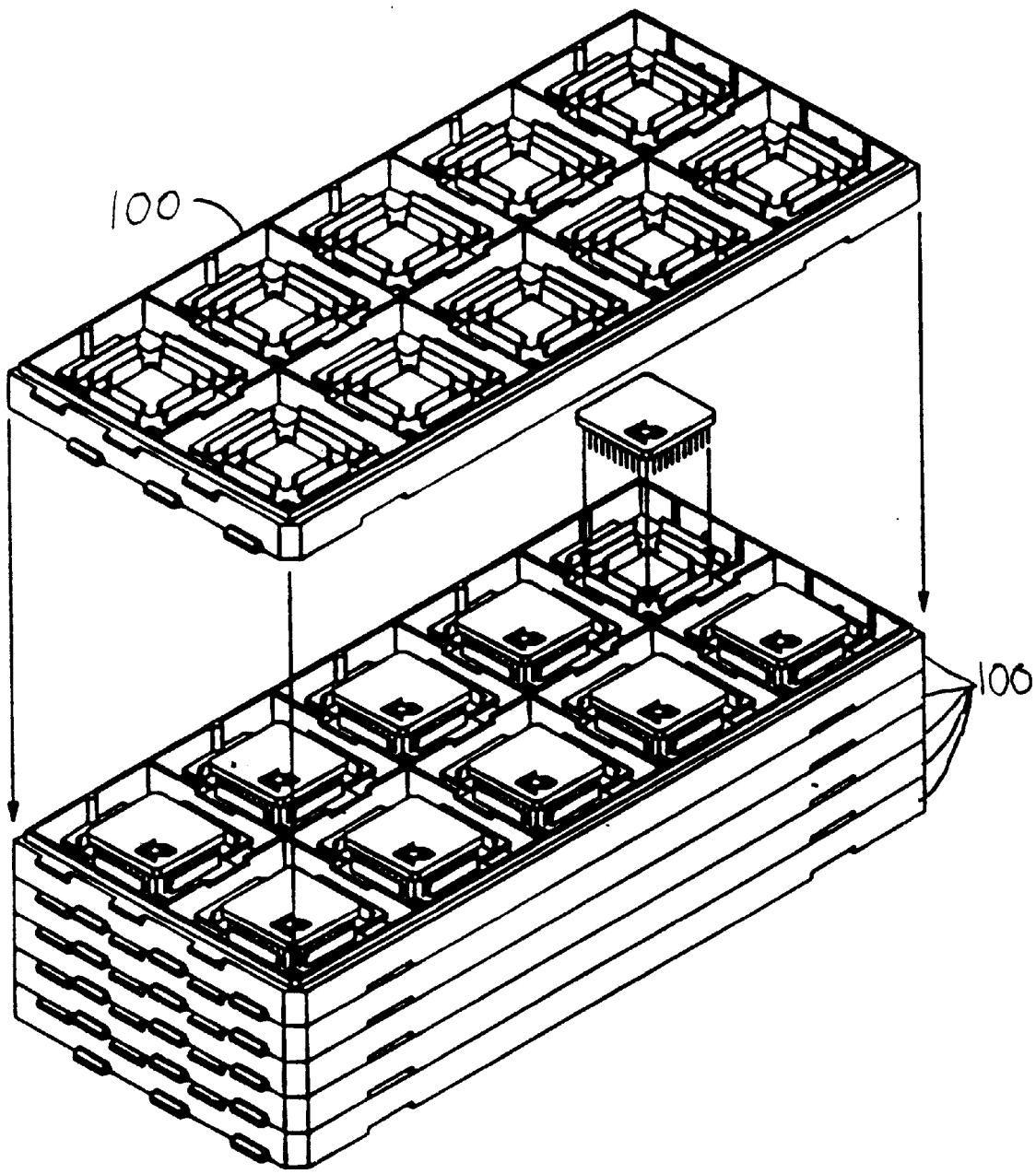
FIG. 1 illustrates a conventional shipping tray.
Figure 2:
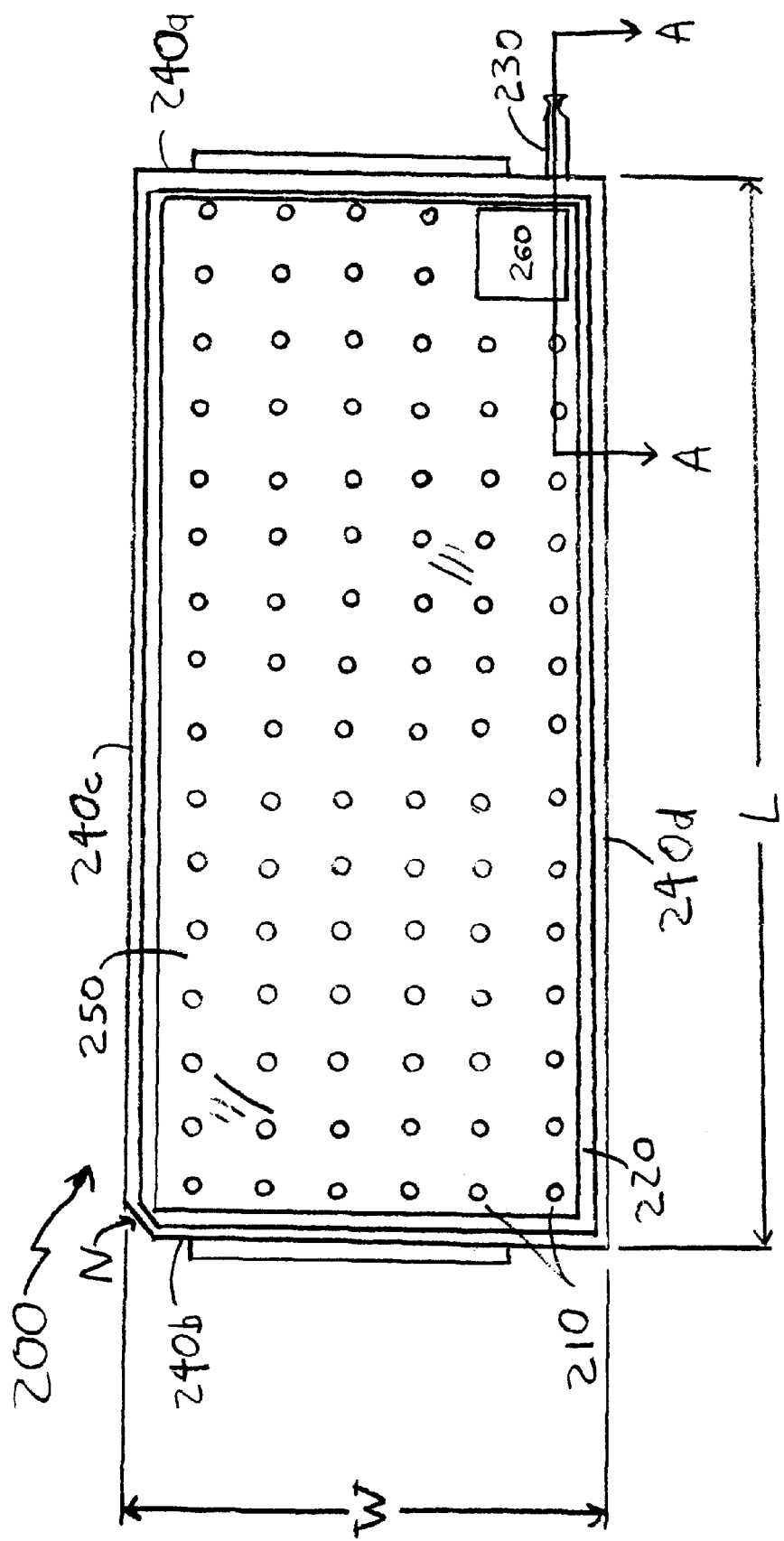
FIG. 2 is a top view of a shipping tray according to an embodiment of the present invention.
Figure 3:
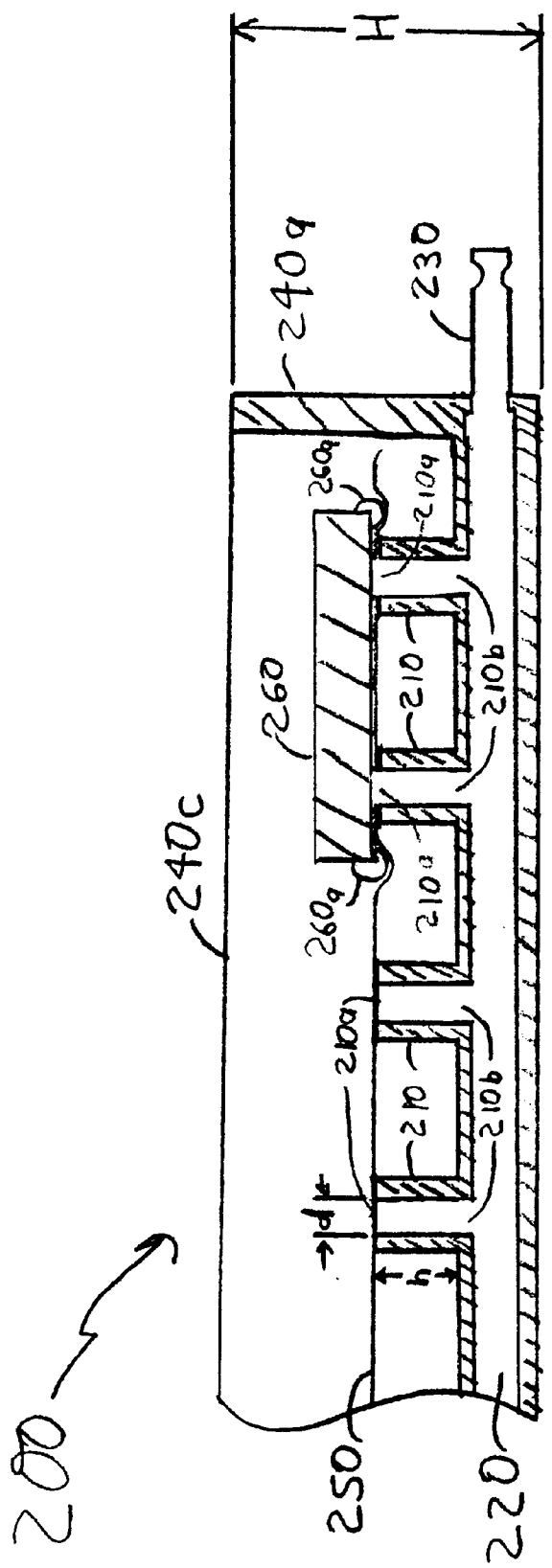
FIG. 3 is a cross-sectional view taken through line A—A of FIG. 2.

A universal shipping tray according to an embodiment of the present invention will now be described with reference to FIGS. 2 and 3. The tray 200 according to the present invention for holding an article, such as a semiconductor package 260, comprises a plurality of hollow tubular pedestals 210, each pedestal 210 having an open top end 210a and an open bottom end 210b in communication with each other. Open top end 210a has a surface area less than a surface area of package 260. Pedestals 210 typically each have a height h of about ⅛ inch, and an inner diameter d of about ⅛ inch. Tray 200 also comprises two pairs of opposing outside vertical walls 240a–d surrounding pedestals 210. Tray 200 has external dimensions that conform to JEDEC standards; for example, height H 7.62 mm, length L 322.6 mm, width W 135.9 mm, corner notch N for orientation 3.0 mm×45 deg., etc.

Pedestals 210 are arranged in a two-dimensional array. Pedestals 210 accommodate packages that are not completely flat; for example, the leads 260a of package 260 extend below the body of package 260. A single package 260 may span one or more pedestals 210. The spacing of pedestals 210 can be optimized according to the range of sizes of the articles tray 200 is to hold. For example, if tray 200 is to hold relatively large size packages, pedestals 210 are spaced about to have a density of about 1 pedestal 210 per square inch. On the other hand, if tray 200 is to hold medium size packages, pedestals 210 are spaced with a density of about 4 pedestals 210 per square inch. Likewise, if tray 200 is to hold relatively small packages, pedestals 210 are spaced with a density of about 9 pedestals 210 per square inch. However, tray 200 preferably is capable of holding a number of differently-designed packages regardless of the spacing of pedestals 210.

A manifold 220 commonly connects bottom ends 210b of pedestals 210. As shown in FIG. 3, manifold 220 is a chamber below pedestals 210 which is sealed except for the pedestal openings. A conventional, normally-closed vacuum valve 230 is located in manifold 220 and is connectable to a vacuum source, such as conventional standard shop vacuum of about 5 to about 12 inches Hg, for evacuating manifold 220 when tray 200 has been loaded, as described hereinafter below. Vacuum valve 230 maintains a vacuum in manifold 220 after it has been evacuated. Pedestals 210 and manifold 220 can be molded integrally with each other, and preferably comprise an antistatic polymer to protect the semiconductor device (not shown) inside package 260 from damage due to ESD. Suitable antistatic polymers include metalized polypropylene oxide (MPPO), polyacrylic sulphin (PAS) and modified polysulphin (MPSU).

Tray 200 also comprises a disposable and removable membrane 250 for covering top ends 210a of pedestals 210. Membrane 250 comprises a flexible polymer sheet having antistatic properties and strong enough to hold a vacuum sufficient to hold package 260 to pedestals 210, such as a mylar or silicone sheet about 5–10 mils thick.

In operation, membrane 250 is placed over pedestals 210 and pierced, as with a needle, to expose the top ends 210a of pedestals 210 that are to hold package 260 against membrane 250 when manifold 220 is evacuated. Package 260 is placed on membrane 250 over the exposed top ends 210a. Manifold 220 is evacuated to hold package 260 against membrane 250, which conforms to the outline of package 260. Package 260 is removed from tray 200 by releasing the vacuum from manifold 220, as through valve 230. Thus, tray 200 can be filled with packages 260 by piercing membrane 250 to expose top ends 210a of all pedestals 210, or partially filled by not exposing top ends 210a that are not to receive packages. Moreover, membrane 250 can be pierced in an automated fashion by programming a modified conventional pick and place robot; for example, a robot programmed to pick up package 260, pierce membrane 250 with a needle provided on its head, then place package 260 on membrane 250 in the appropriate place. Package 260 is preferably placed in tray 200 according to a standard orientation (i.e., as if it were in a standard JEDEC tray), to allow a standard pick and place robot to remove it from tray 200.

The present invention is applicable to the shipping of various types of semiconductor devices, such as TSOPs, SSOPs, PGAs (loaded into tray 200 with pins up), BGAs (loaded with solder balls up), and plastic leaded chip carriers (PLCCs). The present invention thereby eliminates the need for expensive customized shipping trays prior to transporting packages to customers and/or test facilities.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A tray for holding an article, the tray comprising:
   a plurality of hollow tubular pedestals, each pedestal having an open top end and an open bottom end in communication with each other, the open top end having a surface area less than a surface area of the article;
   a manifold commonly connecting the bottom ends of the pedestals;
   a membrane for covering the top ends of the pedestals; and
   a vacuum valve attached to the manifold and connectable to a vacuum source for evacuating the manifold, the vacuum valve being for maintaining a vacuum in the manifold when the manifold is evacuated;

wherein the membrane is piercable to expose the top end of at least one of the pedestals to hold the article against the membrane when the manifold is evacuated and the article placed over the exposed top end.

2. The tray according to claim 1, wherein the pedestals and the manifold comprise an antistatic polymer.

3. The tray according to claim 2, wherein the pedestals and the manifold are integral with each other.

4. The tray according to claim 1, wherein the pedestals each have a height of about 1/8 inch.

5. The tray according to claim 1, wherein the pedestals each have an inner diameter of about 1/8 inch.

6. The tray according to claim 1, wherein the pedestals are arranged in a two-dimensional array having a density of about 1 pedestal per square inch.

7. The tray according to claim 1, wherein the pedestals are arranged in a two-dimensional array having a density of about 4 pedestals per square inch.

8. The tray according to claim 1, wherein the pedestals are arranged in a two-dimensional array having a density of about 9 pedestals per square inch.

9. The tray according to claim 1, wherein the tray comprises two pairs of opposing walls surrounding the pedestals.

10. The tray according to claim 1, wherein the article is a packaged semiconductor device, and the tray has outer dimensions that conform to JEDEC standards.

11. The tray according to claim 1, wherein the membrane comprises a flexible polymer sheet.

12. The tray according to claim 11, wherein the polymer sheet has antistatic properties.

13. The tray according to claim 12, wherein the membrane comprises silicone.

14. The tray according to claim 13, wherein the membrane comprises mylar.

15. The tray according to claim 11, wherein the membrane has a thickness of about 5 mils to about 10 mils.

16. The tray according to claim 1, wherein the manifold comprises a chamber below the pedestals.

17. A method of preparing an article for transport, the method comprising:

providing a tray comprising a plurality of hollow tubular pedestals, each pedestal having an open top end and an open bottom end in communication with each other, a manifold commonly connecting the bottom ends of the pedestals, and a vacuum valve attached to the manifold and connectable to a vacuum source for evacuating the manifold, the vacuum valve being for maintaining a vacuum in the manifold;

placing a flexible membrane over the pedestals;

piercing the membrane to expose the top end of at least one of the pedestals;

placing the article over the exposed top end; and evacuating the manifold to hold the article against the membrane.

18. The method of claim 17, comprising releasing the vacuum and removing the article from the tray.

* * * * *